(12) United States Patent
Harvilchuck

(10) Patent No.: US 9,648,730 B2
(45) Date of Patent: May 9, 2017

(54) SOLID STATE MEMORY UNIT COOLING APPARATUS

(71) Applicant: Xyratex Technology Limited, Havant (GB)

(72) Inventor: Laurence Harvilchuck, Brackney, PA (US)

(73) Assignee: Xyratex Technology Limited, Havant (GB)

( * ) Notice: Subject to any disclaimer, the term of this patent is extended or adjusted under 35 U.S.C. 154(b) by 0 days.

(21) Appl. No.: 14/610,719

(22) Filed: Jan. 30, 2015

(65) Prior Publication Data

US 2015/0216031 A1 Jul. 30, 2015

(30) Foreign Application Priority Data

Jan. 30, 2014 (GB) .................................. 1401618.2

(51) Int. Cl.
| | |
|---|---|
| *H05K 1/02* | (2006.01) |
| *G06F 1/20* | (2006.01) |
| *H05K 7/20* | (2006.01) |
| *H01L 23/467* | (2006.01) |
| *H05K 1/14* | (2006.01) |

(52) U.S. Cl.
CPC ............ *H05K 1/0272* (2013.01); *G06F 1/20* (2013.01); *H01L 23/467* (2013.01); *H05K 7/20154* (2013.01); *G06F 2200/201* (2013.01); *H01L 2224/16225* (2013.01); *H05K 1/0209* (2013.01); *H05K 1/144* (2013.01); *H05K 2201/042* (2013.01); *H05K 2201/064* (2013.01); *H05K 2201/10159* (2013.01)

(58) Field of Classification Search
CPC ............... H05K 1/0272; H05K 1/2039; H05K 1/20145; H01L 23/3672
See application file for complete search history.

(56) References Cited

U.S. PATENT DOCUMENTS

| | | | | |
|---|---|---|---|---|
| 3,478,816 | A | * 11/1969 | Helms | .................. F28D 19/045 165/10 |
| 4,955,131 | A | * 9/1990 | Chall, Jr. | ....... G01R 31/318505 257/E23.004 |
| 6,031,727 | A | 2/2000 | Duesman et al. | |
| 6,765,797 | B2 | * 7/2004 | Summers | ............ H01L 23/4093 165/80.3 |
| 2001/0047858 | A1 | 12/2001 | McCullough | |

(Continued)

FOREIGN PATENT DOCUMENTS

WO 2007/050712 A2 3/2007

OTHER PUBLICATIONS

Combined Search and Examination Report under Sections 17 and 18(3); Intellectual Property Office; Great Britain; pp. 1-8.

*Primary Examiner* — Tuan T Dinh
*Assistant Examiner* — Mukund G Patel
(74) *Attorney, Agent, or Firm* — Hall Estill Attorneys at Law

(57) ABSTRACT

Apparatus for thermally cooling a solid state memory unit, such as but not limited to densely packed flash memory storage devices in a data storage system. In some embodiments, a thermally conductive corrugated plate has one or more corrugations. The corrugations are adapted for positioning adjacent at least one solid state memory unit to form one or more channels for a cooling fluid to flow therethrough.

18 Claims, 3 Drawing Sheets

(56) References Cited

U.S. PATENT DOCUMENTS

| | | | |
|---|---|---|---|
| 2002/0015288 A1* | 2/2002 | Dibene, II | G06F 1/18 |
| | | | 361/711 |
| 2004/0250989 A1 | 12/2004 | Im et al. | |
| 2005/0201063 A1 | 9/2005 | Lee et al. | |
| 2005/0276021 A1 | 12/2005 | Gates et al. | |
| 2007/0001291 A1* | 1/2007 | Park | H01L 24/97 |
| | | | 257/718 |
| 2008/0123300 A1 | 5/2008 | Tian et al. | |

* cited by examiner

SOLID STATE MEMORY UNIT COOLING APPARATUS

RELATED APPLICATION

The present application makes a claim of foreign priority under 35 U.S.C. §119(a) to copending Great Britain Patent Application No. GB1401618.2 filed Jan. 30, 2014.

SUMMARY

Various embodiments of the present disclosure are generally directed to an apparatus for thermally cooling a solid state memory unit, such as but not limited to densely packed flash memory storage devices in a data storage system.

In some embodiments, a thermally conductive corrugated plate has one or more corrugations. The corrugations are adapted to be positioned adjacent at least one solid state memory unit to form one or more channels for a cooling fluid to flow therethrough.

In other embodiments, a solid state memory unit is provided having a printed circuit board (PCB) which supports a solid state memory integrated circuit device having an outer planar surface. A thermally conductive corrugated plate having a plurality of parallel corrugations contactingly engages the outer planar surface of the solid state memory integrated circuit device.

In further embodiments, a data storage device has a base printed circuit board (PCB) which supports first and second solid state memory units. Each of the first and second solid state memory units in turn has a support PCB and at least one solid state memory integrated circuit device. A solid state memory unit cooling apparatus is disposed between the first and second solid state memory units. The cooling apparatus includes a thermally conductive corrugated plate with a plurality of corrugations to form a plurality of parallel channels that extend in a lateral direction across the plate. At least one of the corrugations contactingly engages the solid state memory integrated circuit device of the first solid state memory unit and at least one other of the corrugations contactingly engages the solid state memory integrated circuit device of the second solid state memory unit. A cooling fan generates a flow of cooling fluid that passes through the plurality of parallel channels to remove heat from the first and second solid state memory units.

These and other features and advantages of various embodiments can be understood with a review of the following detailed description section and the accompanying drawings.

DETAILED DESCRIPTION

Figure 1:
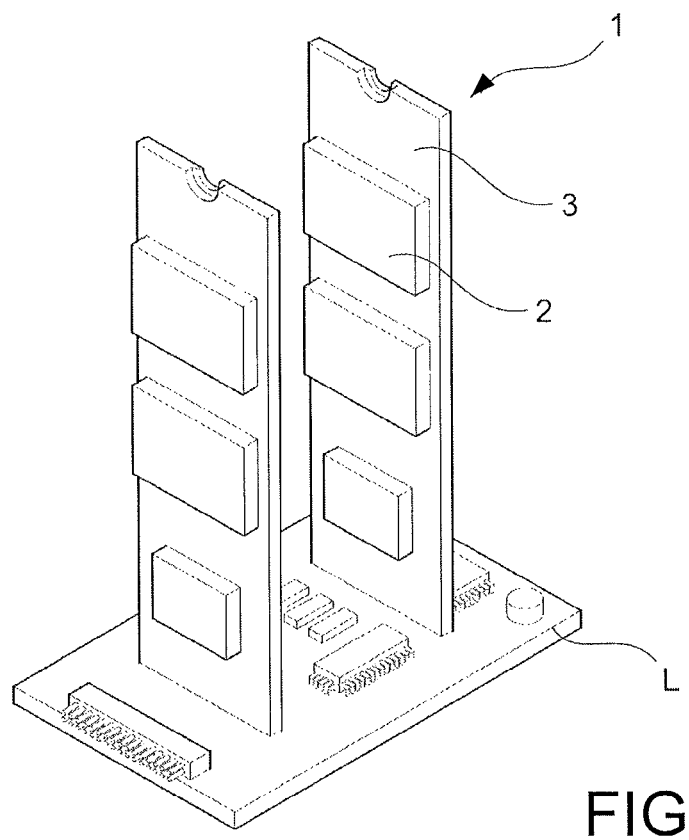
FIG. 1 is a schematic representation of a storage device comprising plural solid state storage units in accordance with some embodiments of the present disclosure.

The present disclosure is generally directed to cooling a solid state memory unit, such as but not limited to arrays of densely packed flash memory storage devices in a data storage system.

A data storage medium often used in typical data storage systems is a rotatable magnetic recording medium (disc), such as the type used in the commonly available 3.5 inch (in) and 2.5 in form factor hard disc drives (HDDs). HDD type data storage devices are relatively large in size and have several moving parts. A general trend in the storage industry is to augment or replace HDD type data storage devices with so-called solid state drives (SSDs). SSDs employ integrated circuits as the data storage media, which tend to have faster response times (e.g., faster read/write times, etc.) and have fewer or no moving parts.

In data storage systems that employ arrays of densely packed solid state memory units, a significant amount of heat can be generated when the system is in operation by virtue of the device function. It is desirable to remove this heat so as to maintain optimal operating conditions. It may also be desirable to remove heat generated by other electronic devices of the data storage system.

Because SSDs can be used as a replacement for HDDs, SSDs are sometimes configured to conform to the existing 3.5 and 2.5 in. HDD form factors. Newer SSD form factors have been proposed, however, that provide smaller footprints and allow greater storage densities. One example is the so-called M.2 format, which uses an edge connector interface which removes one of the main factors limiting the minimum size of an individual data storage unit. A standardized M.2 memory unit has a width and circuit board thickness dimensions of nominally 0.022 meters (m) and 0.003 m, respectively, and may have various lengths ranging from nominally 0.030 m to 0.110 m.

In data storage systems that employ these and other solid state memory units, arrays of solid state memory units such as the above-described M.2 type units can be packed in carriers that otherwise occupy the same volume and perform the same functions as carriers for rotating recording media. The carriers can be stacked, for example, in drawer like structures within an enclosure of a data storage system. In order to achieve maximum space efficiency, the memory units are often closely packed into the enclosures of the data storage system to maximize the number of data storage units in the available space. In this respect, constraints such as the volume of the carriers and other features of the enclosure (for example the side rails, mounting points, and other mechanical, electrical, or thermal interfaces of the enclosure) mean that the clearances between such units are necessarily at a minimum, making it difficult to effectively remove heat generated by the memory units from such a densely packed arrangement by convection alone.

Accordingly, various embodiments of the present disclosure are generally directed to a solid state memory unit cooling apparatus comprising a corrugated plate having one or more corrugations, adapted to be positioned adjacent at least one solid state memory unit to form one or more channels for a fluid to flow therethrough. As explained below, the solid state memory unit cooling apparatus is adapted for installation into the limited space available between solid state memory units and is able to extract heat generated by the operation of the solid state memory units.

In some embodiments, the corrugated plate includes a plurality of corrugations with a varying pitch and/or a varying amplitude. The corrugated plate may include a plurality of substantially sinusoidally shaped corrugations. Additionally or alternatively, the corrugated plate includes at least one planar portion between the corrugations.

In further embodiments, at least one of the channels is blocked to preferentially direct fluid flow through remaining channels formed by the corrugations. The corrugated plate may optionally form a portion of a carrier for the solid state memory unit. The corrugated plate may have a plurality of perforations. Alternatively or additionally, the corrugated plate includes one or more channels for a cooling fluid to flow therethrough. The corrugated plates may also include a coating of thermal interface material (TIM). The corrugated plate may be formed from a metal, a liquid crystal polymer or other thermally conductive material, and may be resiliently deformable.

Reference is now directed to FIG. 1, which generally represents a storage device comprising plural solid state storage units in accordance with some embodiments of the present disclosure. In order to provide a concrete example, it will be contemplated that the storage device utilizes solid state non-volatile flash memory, although it will be appreciated that other forms of solid state memory devices are equally suitable and can be used as desired.

As shown in FIG. 1, the solid state memory device comprises a number of flash memory units 1, each comprising a number of memory modules 2 (microchips) attached to a printed circuit board (PCB) 3. Each memory module 2 has a substantially planar exterior surface. The flash memory units 1 are each connected at one of its edges to a larger logic board L (also a PCB) to form the solid state memory device for connection with other electronic components of a data storage system.

Figure 2:
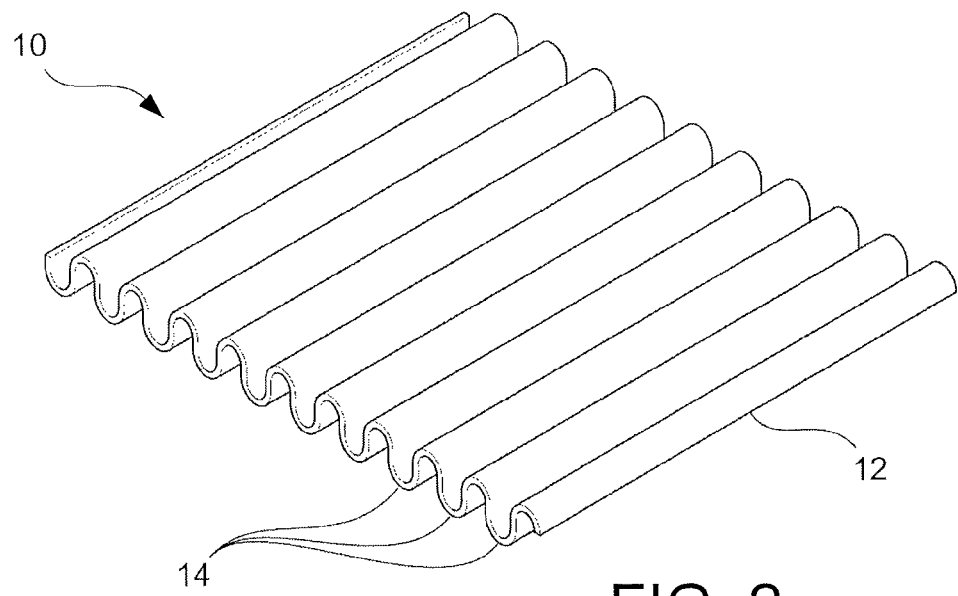
FIG. 2 is a schematic representation of a solid state memory unit cooling apparatus in accordance with some embodiments.

FIG. 2 is a schematic representation of a solid state memory unit cooling apparatus 10. The apparatus 10 takes the form of a corrugated plate 12 with a plurality of adjacent corrugations 14. For reference, each corrugation can be defined as a segment of the plate 12 that extends above and back down to a medial central plane along which the plate is aligned in longitudinal (length) and lateral (width) dimensions. The plate 12 is adapted for insertion between and in contacting engagement with the respective flash memory units 1 of FIG. 1. It will be appreciated that in some data storage systems, a number of the solid state memory devices of FIG. 1 can be packaged in layers within carriers, and the carriers can be stacked within the data storage system.

By positioning the plate 12 between adjacent sets of the memory units 1, the corrugations form channels that extend over the flash memory units 1. The channels allow a flow of a suitable fluid in a desired manner so that when in use, heat generated by the flash memory units is extracted away from the flash memory units by the flowing fluid. The corrugated plate 12 is also arranged so that when the apparatus 10 is in position, the corrugated plate 12 is in thermal contact with the flash memory units 1 to enable heat generated by the flash memory units 1 to transfer to the apparatus 10.

It will be appreciated that the corrugated plate 12 may be arranged to be in thermal contact with one flash memory unit 1 on one side. Alternatively, the corrugated plate 12 may be arranged to be in thermal contact with two flash memory units 1, one on each side.

Further, the corrugated plate 12 may be arranged to extend over an area so as be in thermal contact with more than one flash memory units 1 on either or both sides. The corrugated plate 12 of the apparatus 10 can be formed from a liquid crystal polymer or other thermally conductive material such as metallic materials. In some examples, the corrugated plate 12 is formed from aluminum or another suitable metal. In other examples, the corrugated plate 12 is formed from an aluminum alloy or 300-series stainless steel. By forming the corrugated plate from a thermally conductive material, heat generated by the flash memory unit 1 may also be extracted by conduction directly to the apparatus 10.

Figure 3:
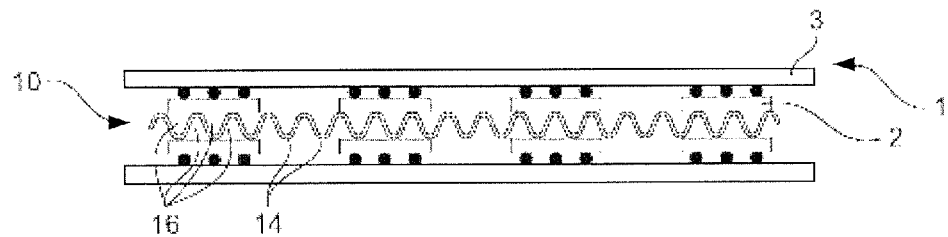
FIG. 3 shows a schematic cross-sectional view of a solid state memory unit cooling apparatus positioned adjacent solid state storage units in accordance with some embodiments.

FIG. 3 shows a cross-sectional view of an embodiment of a flash memory unit cooling apparatus 10 positioned adjacent flash memory units 1 of a data storage system. In this embodiment, the apparatus 10 comprises a corrugated plate 12 having a number of corrugations 14. The corrugations 14 are parallel, regularly spaced, and are arranged to have a substantially sinusoidal cross-section. When placed against the flash memory unit 1, the corrugations 14 and the planar surfaces of the memory modules 2 on the flash memory unit 1 form a number of fluid flow channels 16 that extend over the exterior of the flash memory unit 1. In particular, the channels 16 extend over the planar surfaces of the memory modules 2 so that when a fluid, such as air or any other suitable heat exchange fluid, is passed though the channels 16, heat energy generated by the memory modules 2 is transferred to the flowing fluid and is carried away from the flash memory units 1. For example, air may be made to flow directly through the channels 16 in a lateral direction as shown by the arrows in FIG. 4.

Figure 4:
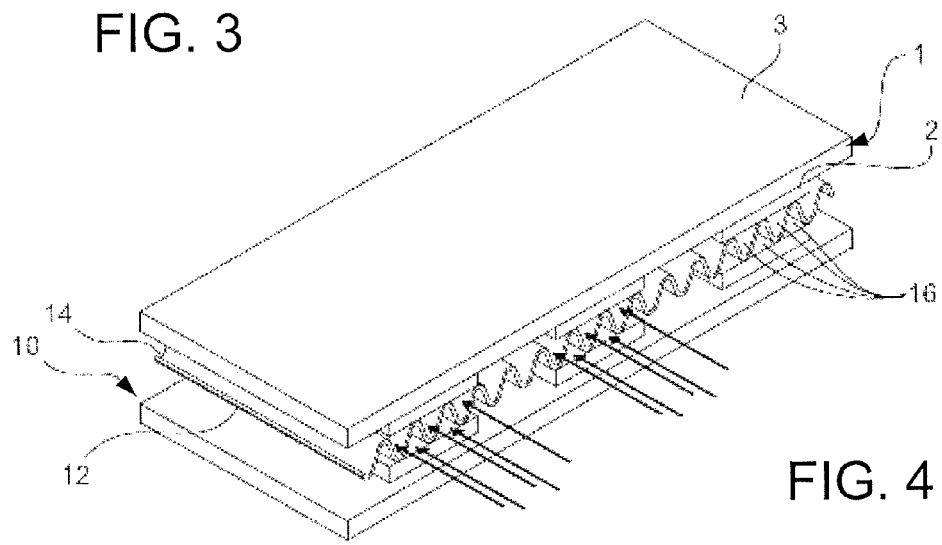
FIG. 4 is an isometric representation of the arrangement of FIG. 3 with a laterally applied cooling fluidic flow.
Figure 5:
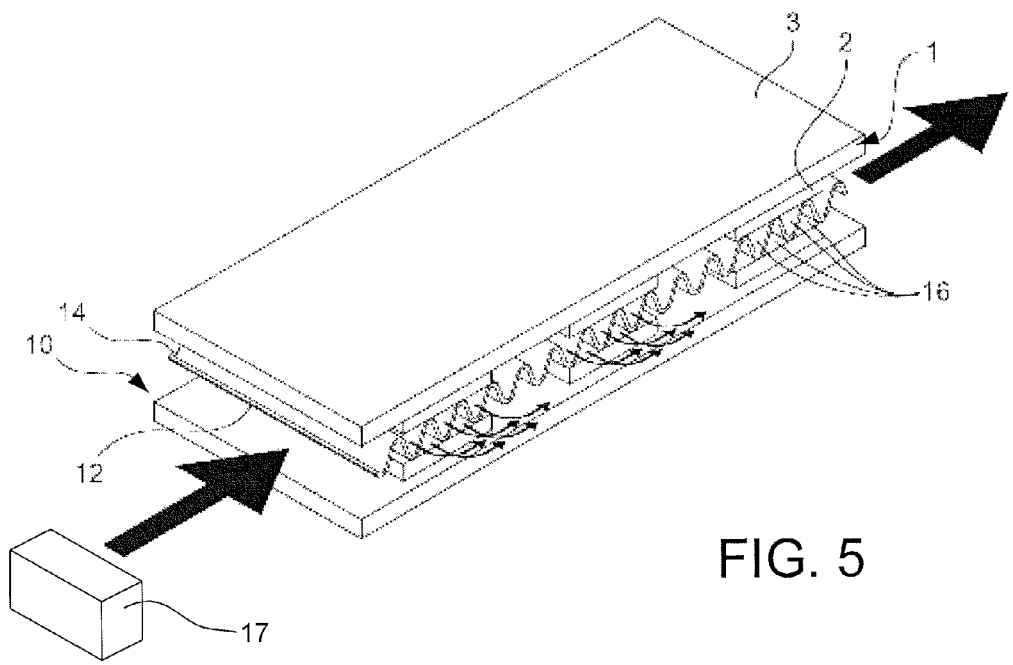
FIG. 5 is an isometric representation of the arrangement of FIG. 3 with a longitudinally applied cooling fluidic flow.

Alternatively, using Bernoulli's Principle as shown in FIG. 5, air may be drawn out from within the channels 16 as indicated by the smaller arrows by providing a flow of air along the edge of the corrugated plate 12 in a longitudinal direction over the ends of the channels 16 as indicated by the larger arrow. In the example shown in FIG. 5, by making the air flow along the edge of the corrugated plate with sufficient pressure, air may be forced to flow into the channels 16 instead of being drawn out of the channels 16. Airflow or other cooling fluidic flow as depicted in FIG. 4 or 5 may be generated by a fluidic flow source 17, such as a cooling fan.

Figure 6:
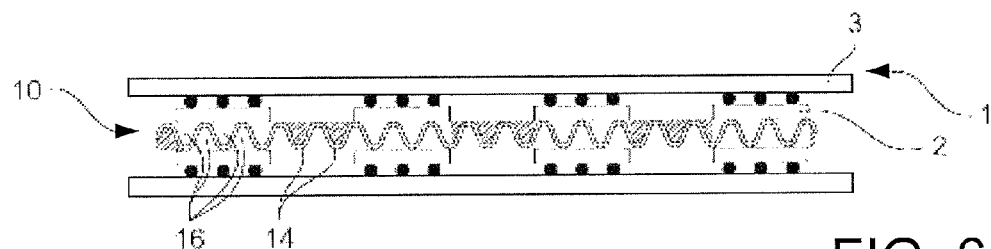
FIG. 6 shows the arrangement of FIG. 3 with the use of a blocking mechanism to partially restrict the application of a cooling fluidic flow as depicted in FIG. 4 or 5.

FIG. 6 shows another embodiment of the apparatus 10. To preferentially direct the airflow to regions that requires cooling the most, for example the regions of the memory modules 2 rather than the region between memory modules 2, the channels 16 of this embodiment of the apparatus 10 are selectively blocked so that air only flow through the channels 16 that are not blocked. Blocking of the 30 channels 16 may be achieved by any suitable blocking mechanism, such as by inserting pieces of insulative foam into the channels 16 or by placing adhesive tape at either or both ends of the channel 16.

To facilitate heat conduction, the corrugated plate 12 of the apparatus 10 may optionally have a coating of thermal interface material (TIM) such as a coating of silicone gel. The coating may be over the entire surface area of the corrugated plate 12. Alternatively, the coating may be on selected portions, such as the surface portions that come into contact with the flash memory unit 1.

To further facilitate heat conduction, the corrugated plate 12 of the apparatus 10 may have one or more planar portions to provide a larger contact area with the memory modules 2 when the apparatus 10 is in use. For example, the corrugated plate may be arranged to have a square-wave cross-section or trapezoidally shaped corrugations.

The corrugated plate 12 of the apparatus 10 is optionally made to be resiliently deformable, by way of perforations provided on the corrugated plate 12 so as to reduce the amount of material or by any other suitable means. Such an arrangement allows the apparatus 10 to be accommodated into different volumes of spaces so that the apparatus 10 functions with flash memory units that have memory modules of varying sizes. Making the apparatus 10 resiliently deformable also allows the apparatus 10 to be compressed to facilitate installation of the apparatus 10 into the limited space available between flash memory units 1 of a data storage system. Once the apparatus 10 is in position, it can be allowed to return to its original shape for intimate contact with the flash memory unit 1.

Figure 7:
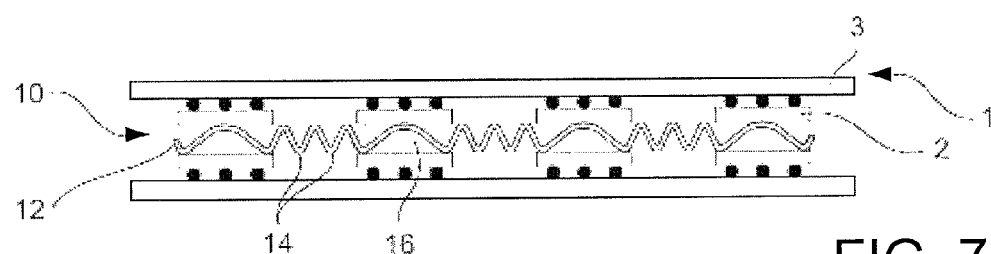
FIG. 7 shows a schematic cross-sectional view of another solid state memory unit cooling apparatus positioned adjacent solid state storage units in accordance with further embodiments.
Figure 8:
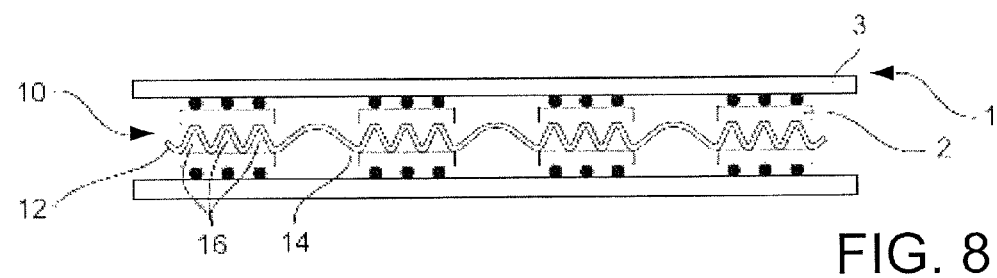
FIG. 8 shows a schematic cross-sectional view of another solid state memory unit cooling apparatus positioned adjacent solid state storage units in accordance with further embodiments.
Figure 9:
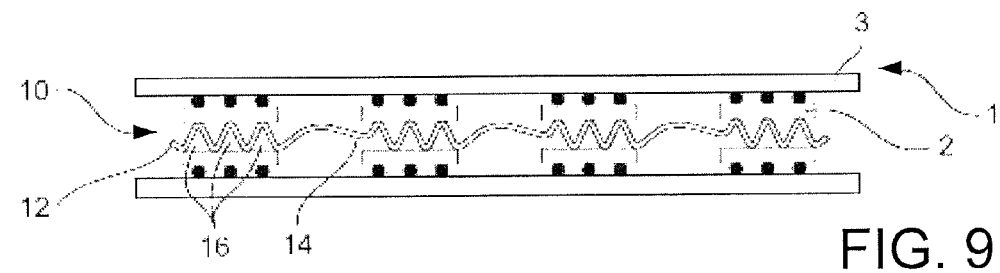
FIG. 9 shows a schematic cross-sectional view of another solid state memory unit cooling apparatus positioned adjacent solid state storage units in accordance with further embodiments.

In the embodiment of the apparatus 10 shown in FIG. 3, the corrugations 14 are arranged to have a nominally constant pitch. That is to say, the peak-to-peak distance of the corrugations 14 is nominally constant. In another embodiment of the apparatus 10, such as that shown in FIG. 7, the corrugations 14 of the corrugated plate 12 are arranged to have a varying pitch. That is to say, the peak-to-peak distances of the corrugations 14 vary along the longitudinal length of the plate. In the embodiment shown in FIG. 7, the apparatus 10 has a corrugated plate 12 that is arranged so that fewer corrugations 14 (e.g., a channel 16 with a larger cross-sectional area) extend over the memory module 2. In another embodiment shown in FIG. 8, a larger number of corrugations 14 are provided at the region of the memory module 2 as compared to the regions 7 between memory modules 2. In yet another embodiment shown in FIG. 9, the corrugations 14 are arranged to have varying amplitude in addition to varying pitch. In particular, in FIG. 9 the amplitude (e.g., the peak-to-peak distance) of the corrugations 14 in the region of the corrugated plate 12 along the space between memory modules 2 is arranged to have a smaller amplitude than the corrugations 14 that are in contact with the memory modules 2. In some other embodiments (not shown), the corrugations 14 are arranged to have varying periodicity.

Optionally for any of the above embodiments of the apparatus 10, the corrugated plate 12 is additionally provided with one or more perforations. In some examples, the perforations are positioned, sized, and distributed so as to facilitate the formation of the various features of the various components described above, particularly when using various metal forming techniques. In other examples, the perforations are arranged such that the apparatus 10 forms at least a portion of a Faraday cage to protect the memory modules 2 from electromagnetic interference.

Furthermore optionally for the above embodiments of the apparatus 10, one or more conduits, such as microfluidic conduits, are provided within the corrugated plate 12. In some examples, the conduits are filled with a suitable cooling fluid to further enhance the cooling capabilities of the apparatus 10. In some other examples, the apparatus 10 is configured to allow the flow of a cooling fluid through the conduits, effectively transforming the apparatus 10 into a radiator-type heat exchanger.

In the above embodiments of the flash memory unit cooling apparatus, the corrugated plate 12 may be a separate component or it may be formed as part of a disk drive carrier of a data storage system.

Embodiments of the present disclosure have been described with particular reference to the examples illustrated. However, it will be appreciated that variations and modifications may be made to the examples described within the scope of the appending claims.

What is claimed is:

1. An apparatus comprising:
   first and second solid state memory units each comprising a printed circuit board (PCB) and respectively supporting first and second solid state memory integrated circuit devices each having an outer planar surface, the first solid state memory integrated circuit device vertically aligned with the second solid state memory integrated circuit device; and
   a thermally conductive corrugated plate having a plurality of parallel corrugations concurrently contacting the outer planar surfaces of the first and second solid state memory integrated circuit devices, the parallel corrugations having a first corrugation pattern between the first and second solid state memory integrated circuit devices and having a second corrugation pattern distal the solid state memory integrated circuit devices, the first and second corrugation patterns being different.

2. The apparatus of claim 1, wherein the second corrugation pattern comprises a plurality of corrugations having a varying pitch along a longitudinal length of the plate.

3. The apparatus of claim 1, wherein the first corrugation pattern comprises a plurality of corrugations having a nominally constant pitch along a longitudinal length of the plate.

4. The apparatus of claim 1, wherein the corrugations of the first corrugation pattern have a nominally sinusoidal cross-sectional shape.

5. The apparatus of claim 1, wherein the plate further comprises at least one planar portion between adjacent sets of corrugations.

6. The apparatus of claim 1, further comprising a blocking mechanism disposed within at least one of the channels formed by the corrugations to block the flow of cooling fluid therethrough.

7. The apparatus of claim 1, wherein the corrugations of the first corrugation pattern each contact an outer surface of an integrated circuit package of the solid state memory unit to conduct heat therefrom, the corrugations further configured to define said channels through which the flow of cooling fluid is directed.

8. The apparatus of claim 1, wherein the corrugations of the first corrugation pattern have a nominally constant peak-to-peak amplitude along a longitudinal length of the plate.

9. The apparatus of claim 1, wherein the plate is formed of a thermally conductive material coated with a layer of silicone gel thermal interface material (TIM).

10. The apparatus of claim 1, wherein the corrugated plate is formed of metal or a thermally conductive liquid crystal polymer.

11. The apparatus of claim 1, wherein at least one channel defined by the corrugations of the second corrugation pattern is blocked to prevent air flow through the at least one channel.

12. The apparatus of claim 1, further comprising a fluidic flow source which generates a cooling flow of fluid that passes through channels formed by the plurality of parallel corrugations to draw heat from the solid state memory integrated circuit device.

13. The apparatus of claim 12, wherein the fluidic flow source directs the cooling flow of fluid in a lateral direction with respect to the plate so that the fluid passes parallel to the channels formed by the corrugations.

14. The apparatus of claim 12, wherein the fluidic flow source directs the cooling flow of fluid in a longitudinal direction with respect to the plate so that the fluid passes adjacent each of the plurality of corrugations.

15. The apparatus of claim 1, wherein the second corrugation pattern has a varying peak-to-peak amplitude along a longitudinal length of the plate.

16. An apparatus comprising:
   a data storage device comprising a base printed circuit board (PCB) and first and second solid state memory units supported by the base PCB, each of the first and second solid state memory units comprising a support PCB and at least one solid state memory integrated circuit device;
   a solid state memory unit cooling apparatus disposed between the first and second solid state memory units and comprising a thermally conductive corrugated plate having a plurality of corrugations that form a plurality of parallel channels that extend in a lateral direction across the plate, wherein a first plurality of the corrugations contacts the solid state memory integrated circuit device of the first solid state memory unit with a first corrugation pattern and a second plurality of the corrugations contacts the solid state memory integrated circuit device of the second solid state memory unit with the first corrugation pattern, the first and second solid state memory integrated circuit device separated by a separation distance, the corrugated plate having a second corrugation pattern throughout the separation distance, the first and second corrugation patterns being different; and
   a cooling fan configured to generate a flow of cooling fluid that passes through the plurality of parallel channels to remove heat from the first and second solid state memory units.

17. The apparatus of claim 16, wherein the solid state memory integrated circuit devices are characterized as flash memory devices.

18. The apparatus of claim 16, wherein the plate comprises a layer of metal and a layer of a thermal interface material (TIM) affixed to the layer of metal, the TIM contactingly engaging a selected one of the solid state memory integrated circuit devices.

* * * * *